United States Patent
Kashiwaya et al.

(10) Patent No.: US 6,882,089 B2
(45) Date of Patent: Apr. 19, 2005

(54) PIEZOELECTRIC/ELECTROSTRICTIVE DEVICE

(75) Inventors: Toshikatsu Kashiwaya, Inazawa (JP); Kazuhiro Yamamoto, Nagoya (JP); Masao Takahashi, Aichi-prefecture (JP)

(73) Assignee: NGK Insulators, Ltd., Nagoya (JP)

( * ) Notice: Subject to any disclaimer, the term of this patent is extended or adjusted under 35 U.S.C. 154(b) by 5 days.

(21) Appl. No.: 10/377,401

(22) Filed: Feb. 28, 2003

(65) Prior Publication Data

US 2003/0175062 A1 Sep. 18, 2003

(30) Foreign Application Priority Data

Mar. 5, 2002 (JP) ......................................... 2002-059451

(51) Int. Cl.⁷ .................... H01L 41/04; H01L 41/08; H01L 41/00
(52) U.S. Cl. ................... 310/358; 310/364; 310/365; 29/25.35
(58) Field of Search ................... 310/258, 364, 310/365; 29/25.35

(56) References Cited

U.S. PATENT DOCUMENTS

| | | | | |
|---|---|---|---|---|
| 5,281,888 A | * | 1/1994 | Takeuchi et al. | 310/366 |
| 5,376,857 A | * | 12/1994 | Takeuchi et al. | 310/328 |
| 5,453,262 A | * | 9/1995 | Dawson et al. | 501/124 |
| 5,504,388 A | * | 4/1996 | Kimura et al. | 310/363 |
| 5,814,920 A | * | 9/1998 | Takeuchi et al. | 310/363 |
| 5,825,119 A | * | 10/1998 | Shibata et al. | 310/338 |
| 5,933,170 A | * | 8/1999 | Takeuchi et al. | 347/71 |
| 6,049,158 A | * | 4/2000 | Takeuchi et al. | 310/328 |
| 6,088,893 A | * | 7/2000 | Takeuchi et al. | 29/25.35 |
| 6,246,156 B1 | * | 6/2001 | Takeuchi et al. | 310/328 |
| 6,265,139 B1 | * | 7/2001 | Yun et al. | 430/330 |
| 6,347,441 B1 | * | 2/2002 | Yun et al. | 29/25.35 |
| 6,504,287 B1 | * | 1/2003 | Yun et al. | 310/328 |
| 6,594,875 B1 | * | 7/2003 | Chang et al. | 29/25.35 |
| 6,677,059 B1 | * | 1/2004 | Shirakawa et al. | 428/690 |
| 6,703,257 B1 | * | 3/2004 | Takeuchi et al. | 438/50 |
| 6,740,900 B1 | * | 5/2004 | Hirai | 257/40 |

FOREIGN PATENT DOCUMENTS

| | | | |
|---|---|---|---|
| JP | 42-15859 | 8/1967 | |
| JP | 42-23747 | 11/1967 | |
| JP | 44-17103 | 7/1969 | |
| JP | 45-8145 | 3/1970 | |
| JP | 60-102779 | 6/1985 | ........... H01L/41/18 |
| JP | 11-29357 | 2/1999 | ........... C04B/35/49 |

\* cited by examiner

Primary Examiner—Thomas M. Dougherty
Assistant Examiner—J. Aguirrechea
(74) Attorney, Agent, or Firm—Burr & Brown

(57) ABSTRACT

A piezoelectric/electrostrictive device is provided, including a ceramic substrate having at least one piezoelectric/electrostrictive layer made of a piezoelectric/electrostrictive ceramic composition and at least one pair of electrodes electrically connected to the piezoelectric/electrostrictive layer formed thereon. The piezoelectric/electrostrictive ceramic composition contains a $PbMg_{1/3}Nb_{2/3}O_3$—$PbZrO_3$—$PbTiO_3$ system composition as a major component, wherein part of Pb is substituted with at least one of Sr and La, and contains Ce in an amount of 0.01 to 0.50% by mass in terms of $CeO_2$. The piezoelectric/electrostrictive layer is solidly attached to the substrate directly or via part of the electrodes.

17 Claims, 4 Drawing Sheets

PIEZOELECTRIC/ELECTROSTRICTIVE DEVICE

BACKGROUND OF THE INVENTION AND RELATED ART STATEMENT

The present invention relates to a piezoelectric/electrostrictive device. More particularly, the present invention relates to a piezoelectric/electrostrictive device which has, on a substrate made of a ceramic, at least one piezoelectric/electrostrictive layer made of a piezoelectric/electrostrictive ceramic composition containing, as a major component, a $PbMg_{1/3}Nb_{2/3}O_3$—$PbZrO_3$—$PbTiO_3$ system composition and at least one pair of electrodes electrically connected to the piezoelectric/electrostrictive layer.

As a device capable of controlling a minute displacement in a submicron order, piezoelectric/electrostrictive devices have been known. In particular, a piezoelectric/electrostrictive device formed by laminating, on a substrate made of a ceramic, a piezoelectric/electrostrictive layer made of a piezoelectric/electrostrictive ceramic composition and an electrode layer to which a voltage is applied, is suitable for control of a minute displacement and moreover has superior properties such as high electromechanical transduction efficiency, high-speed response, high durability, low power consumption and the like. Therefore, the piezoelectric/electrostrictive device is in use in various applications such as piezoelectric pressure sensor, probe-transferring mechanism in scanning tunneling microscope, rectilinear guide mechanism in ultra-precision processing apparatus, servo valve for hydraulic system, head of VTR, picture device constituting flat panel type image display, head of ink jet printer, and the like.

Meanwhile, various investigations have been made on the piezoelectric/electrostrictive ceramic composition constituting the piezoelectric/electrostrictive layer of piezoelectric/electrostrictive device which is an important part of the device determining the properties of the device. In JP-B-44-17103 and JP-B-45-8145 are disclosed, for example, piezoelectric ceramic compositions wherein, in a $Pb(Mg_{1/3}Nb_{2/3})O_3$—$PbTiO_3$—$PbZrO_3$ system composition (this composition may hereinafter be referred to as PMN-PZT system composition), part of Pb is substituted with Sr, La or the like.

Also in JP-B-42-23747 and JP-A-60-102779 are disclosed piezoelectric ceramic compositions wherein Ce is added to a PMN-PZT system composition in an amount of 0.1 to 7.0% by mass or 0.2 to 3.0% by mass.

These piezoelectric ceramic compositions were developed in order to achieve improvement in piezoelectricity, for example, improvement in mechanical quality factor or mechanical quality factor reduction in temperature dependent change of, etc. It was expected that a piezoelectric device of superior piezoelectricity could be provided by using such a composition.

In conventional piezoelectric/electrostrictive devices, various investigations were made on the properties of the piezoelectric/electrostrictive ceramic composition used therein. However, no investigation was made on a problem which a piezoelectric/electrostrictive material made of such a piezoelectric/electrostrictive ceramic composition, when laminated on a substrate, may give rise to interaction to the substrate, etc.

In fact, in a piezoelectric/electrostrictive device produced by laminating, on a substrate, a piezoelectric/electrostrictive material in which part of a PMN-PZT system composition is substituted with Sr, La or the like and then heat-treating the resulting laminate, the piezoelectric/electrostrictive layer has a low density owing to the restraint of the substrate, and there were problems in that the piezoelectric/electrostrictive layer gave a low flexural displacement, or, when a voltage was applied, the low-density portion of the layer gave rise to dielectric breakdown or short circuit.

Also in a piezoelectric/electrostrictive ceramic composition in which Ce is added to a PMN-PZT system composition, no investigation was made as to a problem arising interaction to a substrate, etc. Moreover, the composition per se had no sufficient piezoelectric/electrostrictive property. Particularly, it is the present state that the piezoelectric/electrostrictive property is low in the case that a piezoelectric/electrostrictive ceramic composition is a PMN-PZT system composition to which Ce is added in a relatively large amount.

In contrast, in JP-A-11-29357 is proposed a piezoelectric device produced by beforehand heat-treating a piezoelectric material composed mainly of a PMN-PZT system composition to produce a piezoelectric part and then adhering this piezoelectric part on a ceramic substrate to make dense the piezoelectric portion.

In this piezoelectric device, however, an inorganic or organic adhesive need be used in adhering the piezoelectric part on the ceramic substrate; therefore, there were problems that the adhesive impaired the transmission of oscillation between the substrate and the piezoelectric layer, or the properties of the piezoelectric layer and the substrate were deteriorated since adhesive components penetrated thereinto.

SUMMARY OF THE INVENTION

The present invention has been made in view of the above problems. The object of the present invention is to provide a piezoelectric/electrostrictive device which is superior in the transmission of oscillation between the substrate and the piezoelectric/electrostrictive layer, gives a large displacement, and seldom gives rise to dielectric breakdown or short circuit.

The present inventors made an intensive study in order to attain the above object. As a result, the present inventors have found, as a new finding, that the densification of the piezoelectric/electrostrictive layer may be promoted even when the piezoelectric/electrostrictive material is coated on a substrate and then the resultant is subjected to a heat treatment in the case that a piezoelectric/electrostrictive material is a Ce-added PMN-PZT system composition, and further found that the densification of the piezoelectric layer may be attained without reducing the piezoelectric/electrostrictive properties as long as the Ce content in the piezoelectric/electrostrictive material is in a particular range. Moreover, the present inventors have found that when a PMN-PZT system composition wherein part of Pb is substituted with Sr and/or La, is allowed to contain Ce in a particular range, the improvement in piezoelectric/electrostrictive properties due to substitution with Sr or La becomes very striking. The present invention has been completed based on these findings.

The present invention provides a piezoelectric/electrostrictive device comprising, on a ceramic-made substrate, at least one piezoelectric/electrostrictive layer made of a piezoelectric/electrostrictive ceramic composition and at least one pair of electrodes electrically connected to the piezoelectric/electrostrictive layer, characterized in that the piezoelectric/electrostrictive layer is made of a piezoelectric/electrostrictive ceramic composition containing a $PbMg_{1/3}Nb_{2/3}O_3$—$PbZrO_3$—$PbTiO_3$ system composition wherein part of Pb is substituted with at least one member selected from the group consisting of Sr and La, as a major component and Ce in an amount of 0.01 to 0.50% by mass in terms of $CeO_2$ and that the piezoelectric/electrostrictive layer is solidly attached to the substrate directly or via part of the electrodes.

In the present specification, the expression "be solidly attached" means that the piezoelectric/electrostrictive layer and the substrate or the electrodes are firmly integrated due to a solid-state reaction between them, without using any adhesive of organic type or inorganic type. Further, the expression "major component" means components that are present in the total composition in an amount of 50% by mass or more.

In the present invention, the piezoelectric/electrostrictive ceramic composition constituting the piezoelectric/electrostrictive layer is preferred to contain, as a major component, a PMN-PZT system composition wherein part of Pb is substituted with Sr and La. The piezoelectric/electrostrictive ceramic composition is more preferred to contain, as a major component, a PMN-PZT system composition represented by the following compositional formula (1):

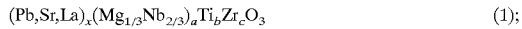

$$(Pb,Sr,La)_x(Mg_{1/3}Nb_{2/3})_aTi_bZr_cO_3 \qquad (1);$$

wherein x is $0.90 \leq x \leq 1.10$; a, b and c are decimal fractions falling, in coordinates formed by three coordinate axes of a, b and c, in a range of (a,b,c)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200); and a+b+c=1.00.

In the present invention, in the compositional formula (1) of the PMN-PZT system composition, x is preferred to be in a range of $0.95 \leq x \leq 0.98$ or $1.02 \leq x \leq 1.05$.

Also in the PMN-PZT system composition, the ratio of Pb substitution with Sr is preferred to be 3.0 to 10.0 mole % and the ratio of Pb substitution with La is preferred to be 0.3 to 1.0 mole %.

Also in the present invention, it is preferable that the piezoelectric/electrostrictive device is provided with a plural number of the piezoelectric/electrostrictive layers and a plural set of the electrodes, and said plural number of piezoelectric/electrostrictive layers are laminated via a negative electrode or a positive electrode alternately of said plural set of the electrodes.

DETAILED DESCRIPTION OF THE INVENTION

Embodiments of the piezoelectric/electrostrictive device of the present invention are specifically described below with referring to the accompanying drawings. In this respect, note that the following referential figures denote the part or portion specified below:

10: piezoelectric/electrostrictive device;
12: substrate;
12A: substrate plate layer;
12B: spacer layer;
12C: thin plate layer;
14: space;
18: through-hole;
20: diaphragm portion;
22: fixation portion;
24 (24a to 24d): piezoelectric/electrostrictive layers; and
26 (26a, 26b), 27 (27a, 27b), 28 (28a to 28e), 36 (36a, 36b): electrodes.

Description is made mainly on a piezoelectric device, and the same basic description applies to an electrostrictive device.

Figure 1:
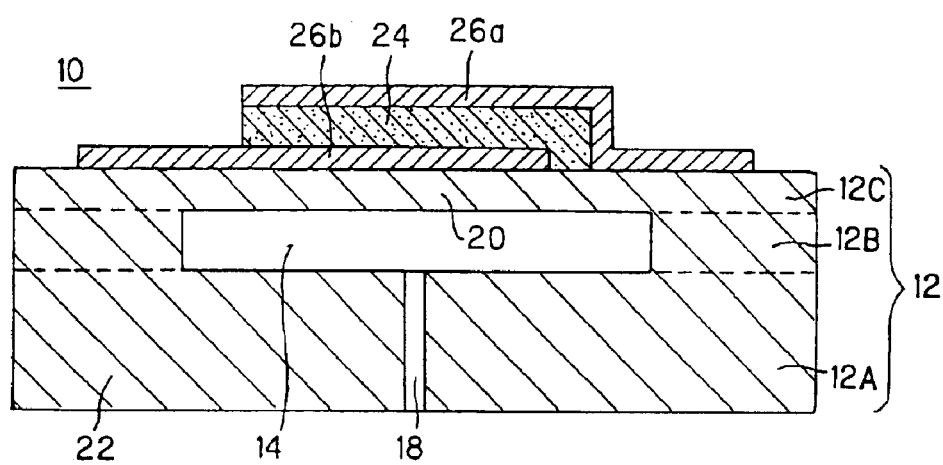
FIG. 1 is a sectional view showing an example of the piezoelectric/electrostrictive device of the present invention.

As shown in FIG. 1, the piezoelectric/electrostrictive device 10 of the present invention has, on a ceramic-made substrate 12, at least one piezoelectric/electrostrictive layer 24 made of a particular piezoelectric/electrostrictive ceramic composition and at least one pair of electrodes 26a and 26b electrically connected to the piezoelectric/electrostrictive layer. The piezoelectric/electrostrictive layer 24 is solidly attached to the substrate 12 directly or via the electrode 26b Hereinafter, specific description is made on each constituent of the present piezoelectric/electrostrictive device.

As shown in FIG. 1, the substrate 12 of the present invention is preferably an integrated structure of (1) a diaphragm portion 20 constituted by a thin ceramic plate and (2) a fixing portion 22 made of a thick ceramic material. In this case, the diaphragm portion 20 is provided at a position approximately corresponding to the piezoelectric/electrostrictive layer 24, and the fixing portion 22 is provided at other position. A space 14 is ordinarily provided beneath the diaphragm portion 20.

The thickness of the diaphragm portion 20 is preferably in such a range that the mechanical strength of the device is secured and yet the flexural displacement of the piezoelectric/electrostrictive layer 24 is not reduced by an increase in rigidity. Specifically, the thickness is preferably 1 to 100 μm, more preferably 3 to 50 μm, particularly preferably 5 to 30 μm.

The space 14 provided beneath the diaphragm portion 20 is preferably communicated to outside by a through-hole 18 of small diameter which also communicates to a side of the diaphragm portion 20 opposite to its side solidly attached to the piezoelectric/electrostrictive layer 24 or the electrode 26b.

It is because when the space 14 is in a closed state, the air inside the space 14 becomes a pressurized state or a negative pressure state depending upon the displacement of the space 20 and the diaphragm portion 20 is difficult to displace.

Such a substrate 12 can be produced, for example, by laminating a substrate plate layer 12A having a through-hole of small diameter, a spacer layer 12B having a space, and a thin plate layer 12C having a thickness corresponding to the diaphragm portion 20, in this order to form an integrated structure. In this case, the substrate plate layer 12A functions as a reinforcing substrate plate and, by providing, at the lower side of the substrate plate layer 12A, a wiring communicating to the electrode 26, can be allowed to also function as a substrate plate for wiring. The layers 12A to 12C constituting the substrate 12 may be fired simultaneously to obtain an integrated structure, or may be laminated one by one and then fired to obtain an integrated structure, or may be independently fired and then laminated to obtain an integrated structure.

In the present invention, the substrate 12 is made of a ceramic. However, the diaphragm portion 20 is preferably made of a material superior in heat resistance and chemical stability which shows no property change when a piezoelectric/electrostrictive material, an electrode material or the like all laminated on the diaphragm portion 20 is heat-treated. Further, the diaphragm portion 20 is preferably an electrical insulating material because it electrically separates a wiring communicating to the electrode 26b formed on the substrate 12.

Specifically explaining, the ceramic constituting the diaphragm portion 20 is preferred to be, for example, a ceramic containing at least one kind selected from the group consisting of stabilized zirconium oxide, aluminum oxide, magnesium oxide, titanium oxide, spinel, mullite, aluminum nitride, silicon nitride and glass. A ceramic containing stabilized zirconium oxide is preferred because one may improve the durability of the diaphragm portion 20 to which an oscillation is always given even making it with a thinner structure due to its high mechanical strength and superior tenacity, and moreover it has high chemical stability and is very low in reactivity with the piezoelectric/electrostrictive layer 24 and the electrodes.

Here, the term "stabilized zirconium oxide" means zirconium oxide in which phase transition of crystal is controlled by addition of a stabilizer, and includes stabilized zirconium oxide and partially stabilized zirconium oxide.

As stabilized zirconium oxide, there can be mentioned those containing a stabilizer such as calcium oxide, magnesium oxide, yttrium oxide, scandium oxide, ytterbium oxide, cerium oxide, rare device metal oxide or the like, in an amount of 1 to 30 mole %. One containing yttrium oxide as a stabilizer is preferred because such a material can allow the diaphragm portion 20 to have a very high mechanical strength. In this case, the content of yttrium oxide is preferably 1.5 to 6 mole %, more preferably 2 to 4 mole %. Additionally preferred is one containing aluminum oxide in an amount of 0.1 to 5 mole %.

The crystal phase of stabilized zirconium oxide may be a mixed phase of cubic system and monoclinic system, a mixed phase of tetragonal system and monoclinic system, a mixed phase of cubic system, tetragonal system and monoclinic system, etc. A stabilized zirconium oxide containing, as a major crystal phase, a tetragonal system or a mixed phase of tetragonal system and cubic system is preferred from the standpoints of strength, tenacity and durability.

In the present invention, the diaphragm portion 20 of the substrate 12 may contain, besides the above-mentioned ceramic, a component used as a sintering aid, such as silicon oxide, boron oxide or the like all contained in clay, etc. However, when such a component is contained excessively, the substrate 12 and the piezoelectric/electrostrictive layer 24 react with each other; as a result, the particular composition of the piezoelectric/electrostrictive layer 24 is difficult to maintain and the piezoelectric/electrostrictive property is reduced. Therefore, in the diaphragm portion 20 of the substrate 12 of the present invention, the content of the component such as silicon oxide, boron oxide or the like all contained in clay, etc. is preferably 3% by mass or less, more preferably 1% by mass or less.

In the ceramic constituting the diaphragm portion 20, the average particle diameter of crystal grains is preferably 0.05 to 2 μm, more preferably 0.1 to 1 μm in order for the diaphragm portion 20 to have a higher mechanical strength.

Meanwhile, the fixing portion 22 of the substrate 12 basically makes no direct contact with the piezoelectric/electrostrictive layer and the electrodes unlike the diaphragm portion 20. The fixing portion 22 therefore does not need to be made of a ceramic having the same properties as possessed by the ceramic used in the diaphragm portion 20, and may be made of the same ceramic as in the diaphragm portion 20 or may be made of a different ceramic.

The fixing portion 22 is preferably made of a material composed mainly of zirconium oxide, a material composed mainly of aluminum oxide, or a material composed mainly of a mixture thereof, in view of the high mechanical strength. Of these, a material composed mainly of zirconium oxide is particularly preferred.

Next, the piezoelectric/electrostrictive layer of the present invention is described. As mentioned previously, the piezoelectric/electrostrictive layer 24 of the present invention is made of a piezoelectric/electrostrictive ceramic composition containing a PMN-PZT system composition wherein part of Pb is substituted with at least one kind selected from Sr and La, as a major component and Ce in an amount of 0.01 to 0.50% by mass in terms of $CeO_2$, and is solidly attached to the substrate 12 directly or via the electrode 26b mentioned later.

Thereby, it is possible to prevent (1) a reduction in transmission of oscillation between the substrate 12 and the piezoelectric/electrostrictive layer 24 due to the presence of adhesive therebetween, etc. and (2) property deterioration of the piezoelectric/electrostrictive layer 24 or the diaphragm portion 20, due to the effect of adhesive component, etc. Further, the piezoelectric/electrostrictive layer 24 has superior piezoelectric/electro strictive properties and hardly experiences dielectric breakdown or short circuits.

In the present invention, the piezoelectric/electro strictive ceramic composition constituting the piezoelectric/electrostrictive layer 24 is preferred to contain, as a major component, a PMN-PZT system composition in which part of Pb is substituted with Sr and La, because such a piezoelectric/electrostrictive layer 24 can have a larger flexural displacement.

More preferably, the piezoelectric/electrostrictive ceramic composition contains as a major component, a PMN-PZT system composition represented by the following formula (1):

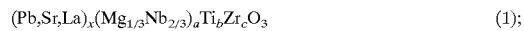

$$(Pb,Sr,La)_x(Mg_{1/3}Nb_{2/3})_aTi_bZr_cO_3 \qquad (1);$$

wherein x is $0.90 \leq x \leq 1.10$; a, b and c are decimal fractions falling, in coordinates formed by three coordinate axes of a, b and c, in a range of (a,b,c)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200); and a+b+c=1.00.

In the compositional formula (1) of the PMN-PZT system composition, x is preferred to be in a range of $0.94 \leq x \leq 0.99$ or $1.01 \leq x \leq 1.06$ and is more preferred to be in a range of $0.95 \leq x \leq 0.98$ or $1.02 \leq x \leq 1.05$. The reason is that when x in the compositional formula (1) is in the above range, a very large flexural displacement is obtained. Incidentally, as can be taken from the above-mentioned, the peak in the flexural displacement is observed in a bimodal fluctuation as the "x" comes near to 1.00 (stoichiometric compositional ratio), in accordance with the change of the "x."

In the present invention, it is preferred that in the PMN-PZT system composition, substitution of part of Pb with Sr or La is kept within a particular range in order to increase flexural displacement with keeping the fluctuation of flexural displacement, depending upon temperature change.

Specifically, when part of the Pb in the PMN-PZT system composition is substituted with Sr, the substitution amount of Pb is preferably 1.0 to 13.0 mole %, more preferably 2.0 to 11.0 mole %, further preferably 3.0 to 10.0 mole %, furthermore preferably 4.0 to 8.0 mole %, and particularly preferably 5.0 to 7.0 mole %. When part of the Pb in the PMN-PZT system composition is substituted with La, the substitution amount of Pb is preferably 0.1 to 1.3 mole %, more preferably 0.2 to 1.1 mole %, further preferably 0.3 to 1.0 mole %, furthermore preferably 0.4 to 0.9 mole %, and particularly preferably 0.5 to 0.8 mole %.

In the present invention, the piezoelectric/electrostrictive ceramic composition constituting the piezoelectric layer 24 preferably contains Ce in an amount of 0.02 to 0.40% by mass, more preferably in an amount of 0.03 to 0.30% by mass, further preferably in an amount of 0.04 to 0.25% by mass, particularly preferably in an amount of 0.05 to 0.20% by mass in terms of $CeO_2$.

If the content of Ce in the piezoelectric/electrostrictive ceramic composition is adjusted within the above range, the densification of the piezoelectric/electrostrictive layer 24 may be promoted without causing substantial reduction in the piezoelectric property of the composition, due to the presence of Ce therein, and thereby a piezoelectric/electrostrictive layer 24 of larger flexural displacement can be obtained.

In the present invention, the thickness of the piezoelectric/electrostrictive layer 24 is preferred to be approximately the same as that of the substrate 12 for securement of mechanical strength of device and desired flexural displacement. Specifically, the thickness ratio of the diaphragm portion of the substrate to the piezoelectric/electrostrictive layer is preferably 0.1 to 30, more preferably 0.3 to 10, and particularly preferably 0.5 to 5.

When the thickness ratio of the substrate 12 to the piezoelectric/electrostrictive layer is in the above range, the substrate 12 (the diaphragm portion 20) easily follows the during-firing shrinkage of the piezoelectric/electrostrictive layer 24 when a piezoelectric/electrostrictive material is coated on the substrate 12, followed by a heat treatment to form the piezoelectric/electrostrictive layer 24. The substrate 12 and the dense piezoelectric/electrostrictive layer 24 can also be made into an integrated structure with no occurrence of peeling. Further, the integrated body can have sufficient durability to the oscillation caused by the flex of the piezoelectric/electrostrictive layer 24.

In order to achieve a small device, the thickness of the piezoelectric/electrostrictive layer 24 is preferably 5 to 100 $\mu$m, more preferably 5 to 50 $\mu$m, and particularly preferably 5 to 30 $\mu$m.

In the present invention, the piezoelectric/electrostrictive layer 24 can be obtained by coating a piezoelectric/electrostrictive material made of the above-mentioned piezoelectric/electrostrictive ceramic composition, on a substrate 12 or an electrode 26b formed on the substrate 12 and then subjecting the resulting material to a heat treatment at a predetermined temperature.

The piezoelectric/electrostrictive material can be prepared, for example, by an oxide mixing method.

Specifically, it can be prepared, for example, by a method which comprises weighing raw material powders of PbO, $SrCO_3$, $MgCO_3$, $Nb_2O_5$, $ZrO_2$, $TiO_2$, $CeO_2$, etc. so as to give a required composition, followed by mixing, calcinating and grinding. As other methods, a co-precipitation method, an alkoxide method, etc. can be mentioned.

To form the piezoelectric/electrostrictive layer 24 on the substrate 12, a thick film-forming method such as screen printing, dipping, coating, electrophoresis or the like, or a thin film-forming method such as ion beam method, sputtering, vacuum deposition, ion plating, chemical vapor deposition (CVD), plating or the like can be used.

In the present invention, the piezoelectric/electrostrictive layer 24 can be formed using a paste, a slurry, a suspension, an emulsion, a sol or the like, all composed mainly of piezoelectric/electrostrictive ceramic particles having an average diameter of 0.01 to 5 $\mu$m, preferably 0.05 to 3 $\mu$m and the formed piezoelectric/electrostrictive layer 24 has good piezoelectric/electrostrictive property; therefore, there is preferred a thick film-forming method such as screen printing, dipping, coating, electrophoresis or the like can be used.

Of these, electrophoresis is particularly preferred because the film formed has a high density and a high dimensional accuracy and is uniform, dense and continuous over a wide area, the film can be formed at a high deposition rate in a large thickness, and the operation can be conducted using a simple device (Denki Kagaku and Kogyo Butsuri Kagaku Vol. 53, No. 1 (1985), pp. 63 to 68, written by Kazuo Anzai).

The heat treatment of the piezoelectric/electrostrictive material is preferably conducted by laminating the piezoelectric/electrostrictive material on the substrate 24 or the electrode 26b, in order to solidly attach the piezoelectric/electrostrictive layer 24 to the substrate 12 directly or via the electrode 26b. In order to prevent vaporization of the individual components of the piezoelectric/electrostrictive material to obtain a ceramic composition of desired formulation, the heat treatment of the piezoelectric/electrostrictive material is preferably carried out in the co-existence of an atmosphere-controlling material having the same composition as the piezoelectric/electrostrictive material does.

The temperature of the heat treatment is preferably 1,000 to 1,400° C., more preferably 1,100 to 1,350° C. The heat treatment may be conducted before electrode formation, but may also be conducted after electrode formation. In the case of a piezoelectric/electrostrictive device of lamination type, the heat treatment may be conducted each time when each piezoelectric/electrostrictive layer has been formed, or when all electrodes and all piezoelectric/electrostrictive layers have been formed, or each time when some of them have been formed.

Next, the electrodes of the present invention are described.

As shown in FIG. 1, the electrodes 26a and 26b of the present invention are electrically connected to the piezoelectric/electrostrictive layer 24. As a representative case thereof, there can be mentioned an arrangement in which one pair of filmy electrodes 26a and 26b are laminated on the upper and lower surfaces of a piezoelectric/electrostrictive layer 24.

Figure 2:
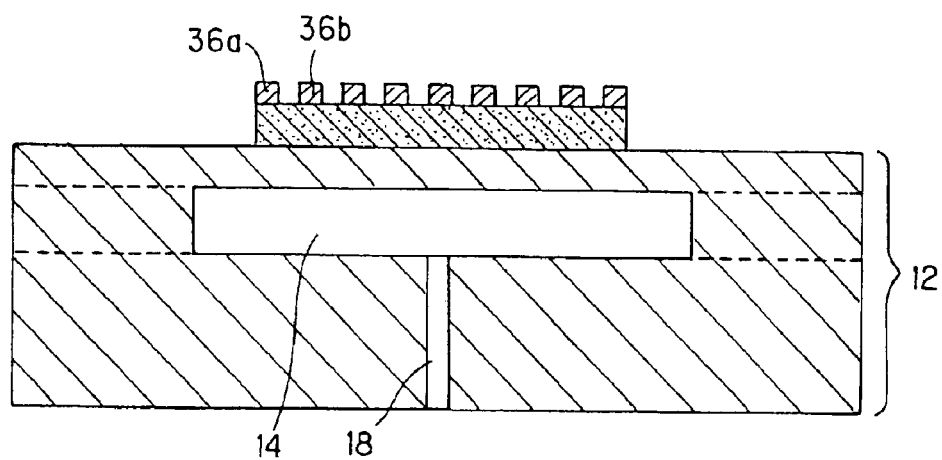
FIG. 2 is a sectional view showing the first modification of the piezoelectric/electrostrictive device of the present invention.
Figure 3:
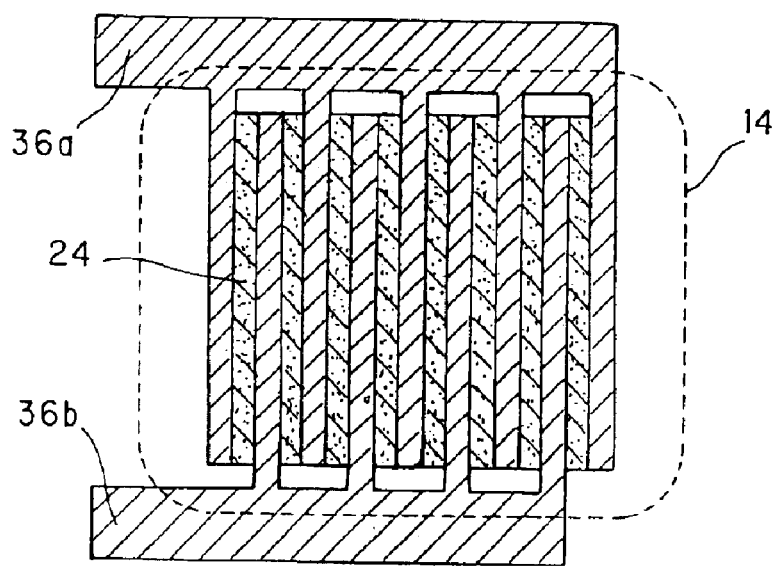
FIG. 3 is an enlarged plan view showing the electrode portion of the piezoelectric/electrostrictive device shown in FIG. 2.
Figure 4:
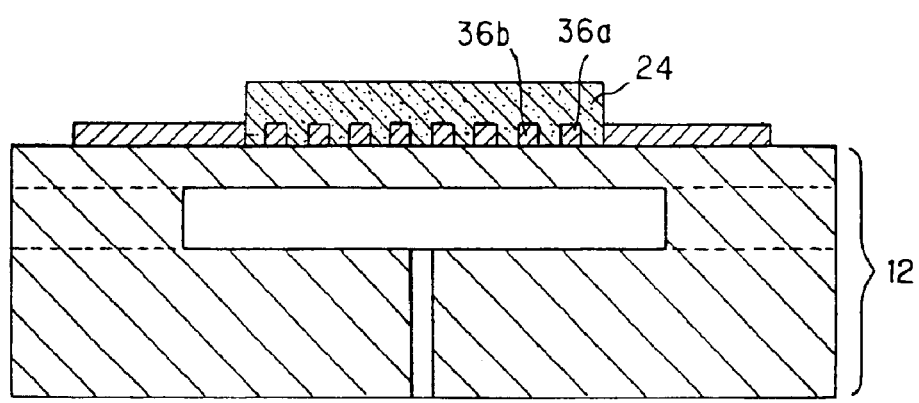
FIG. 4 is a sectional view showing the second modification of the piezoelectric/electrostrictive device of the present invention.

There can be mentioned, as modified cases, the arrangement shown in FIGS. 2 and 3, in which one pair of electrodes (36a and 36b) are formed on the upper surface of a piezoelectric/electrostrictive layer 24 in a comb shape, and an arrangement shown in FIG. 4, in which one pair of electrodes 36a and 36b are formed on the lower surface of a piezoelectric/electrostrictive layer 24 in a comb shape.

Figure 5:
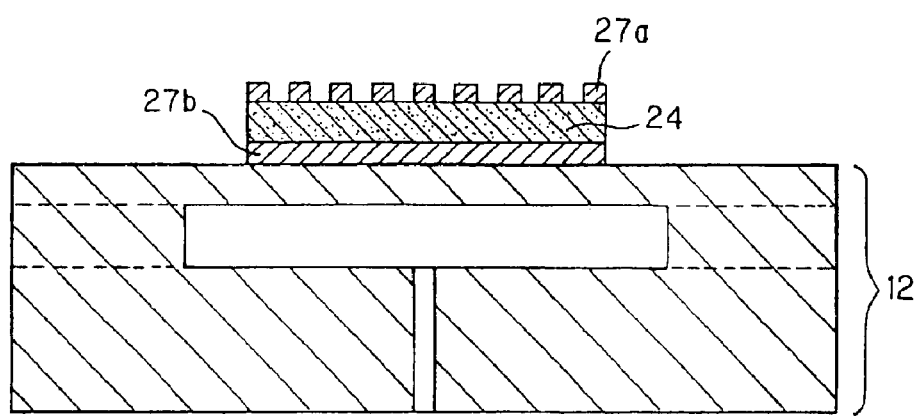
FIG. 5 is a sectional view showing the third modification of the piezoelectric/electrostrictive device of the present invention.
Figure 7:
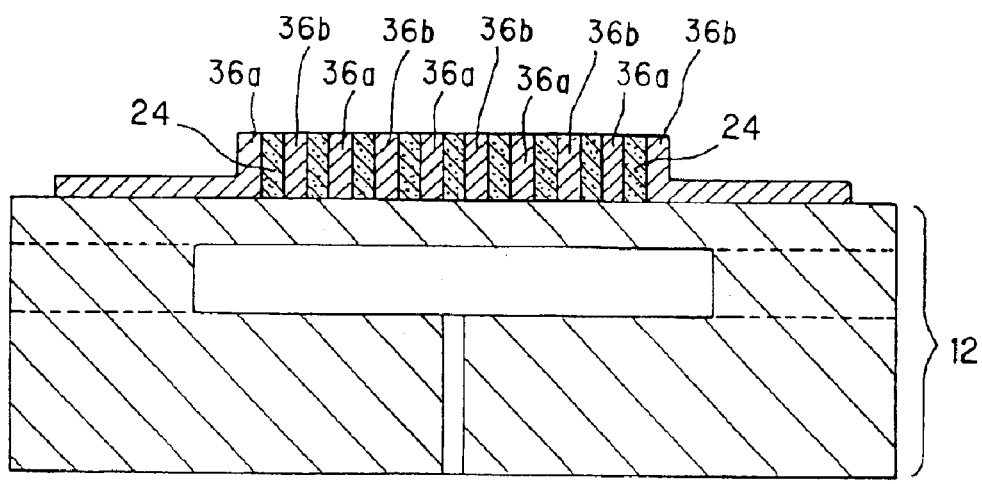
FIG. 7 is a sectional view showing the fifth modification of the piezoelectric/electrostrictive device of the present invention.

There can further be mentioned the arrangement shown in FIG. 5, in which a single plate electrode 27b is formed on the lower surface of a piezoelectric/electrostrictive layer 24 and a plurality of stripe-like electrodes 27a is formed on the upper surface of the piezoelectric/electrostrictive layer 24, and the arrangement shown in FIG. 7, in which one pair of electrodes having a comb shape 36a and 36b is implanted into a piezoelectric/electrostrictive layer 24 so that the electrodes 36a and 36b are provided alternately between the respective portions of the piezoelectric/electrostrictive layers 24 divided in an electric field direction.

Figure 6:
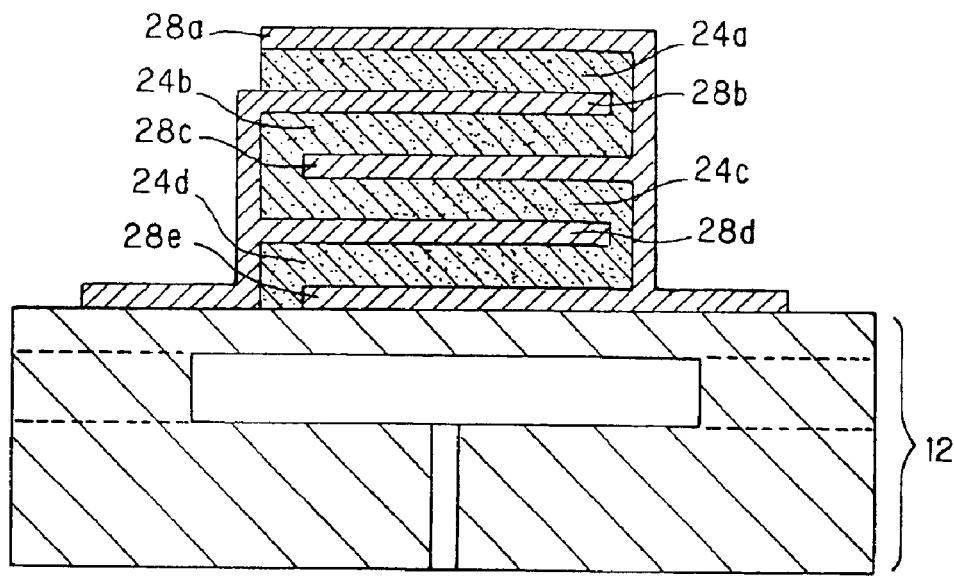
FIG. 6 is a sectional view showing the fourth modification of the piezoelectric/electrostrictive device of the present invention.

In the present invention, it is also possible to prepare a plurality of piezoelectric/electrostrictive layers 24a to 24d and a plurality of electrode sets 28a to 28e, and interpose the negative electrodes 28b and 28d and the positive electrodes 28a, and 28c alternately between the piezoelectric/electrostrictive layer 24a to 24d and dispose the positive electrode 28e on the substrate, thereby producing a piezoelectric/electrostrictive device of lamination type as shown in FIG. 6.

Incidentally, the structures shown in FIGS. 2 to 6 are advantageous in that the power consumption is low; and the structure shown in FIG. 7 is advantageous in generation of large displacement because it can effectively utilize an inverse piezoelectric effect in an electric field direction.

In the present invention, the thickness of the electrodes may be determined appropriately depending upon the application of the present device. With an excessively large thickness, the electrodes function as a relaxation layer and give a low flexural displacement. Therefore, the thickness is preferably 0.01 to 50 $\mu$m, more preferably 0.1 to 5 $\mu$m.

In the present invention, there is no particular restriction as to the material of electrode. However, as the material of the electrode 26b shown in FIG. 1, etc., formed on the lower surface of the piezoelectric/electrostrictive layer 24 and solidly attached to the substrate 12, there are preferred, for heat resistance and conductivity, a simple metal of platinum group metals, an alloy between a simple metal of platinum group metals and gold and/or silver, an alloy among platinum group metals, an alloy of at least two kinds of metals of platinum group metals or an alloy of at least two kinds of metals of platinum group metals-with gold and/or silver. Of these, particularly preferred a material composed mainly of platinum.

Meanwhile, the electrode 26a shown in FIG. 1 formed on the upper surface of the piezoelectric/electrostrictive layer 24 may be made of a conductive metal which is a solid at room temperature. Examples of such metals include a simple metal selected from the group consisting of aluminum, titanium, chromium, iron, cobalt, nickel, copper, zinc, niobium, molybdenum, ruthenium, rhodium, silver, tin, tantalum, tungsten, iridium, platinum, gold, lead, and an alloy containing at least one of metals mentioned above.

Incidentally, when a piezoelectric/electrostrictive device of lamination type shown in FIG. 6 is formed, the materials of the electrodes 28a to 28e may all be the same for all the electrodes or may be different for part or all of the electrodes.

As the method for forming electrodes, ion beam, sputtering, vacuum deposition, PVD, ion plating, CVD, plating, screen printing, spraying and dipping can be used. Of these, sputtering and screen printing are preferred examples that can be used to ensure bondability between the ceramic substrate and the piezoelectric/electrostrictive portion.

The formed electrodes can be integrated with the substrate and/or the piezoelectric/electrostrictive portion by a heat treatment of about 1,000 to 1,400° C. In this case, the heat treatment of the electrodes may be carried out before lamination of the piezoelectric/electrostrictive material, at the time when the electrodes have been formed; or after lamination of the piezoelectric/electrostrictive material.

EXAMPLES

The present invention is described more specifically below by way of Examples of piezoelectric devices. However, the present invention is in no way restricted by these Examples. Incidentally, in the following Examples and Comparative Examples, evaluations were made as follows.
Evaluation Methods
(1) Flexural Displacement An electric field of 3 kV/mm is applied to each piezoelectric device of each Example or each Comparative Example at room temperature. The resulting displacement is measured using a laser displacement tester.
(2) Molar Ratio in Composition In each of the PMN-PZT system compositions used in the piezoelectric devices of Examples and Comparative Examples, there was shown a molar ratio of total mole of Pb, Sr and La to total mole of Mg, Nb, Zr and Ti. In Table 1, the total mole of Pb, Sr and La was expressed as A, and the total mole of Mg, Nb, Zr and Ti was expressed as B. Incidentally, when the PMN-PZT system composition has a stoichiometric compositional ratio, the ratio of A/B becomes 1.
(3) Ratio of Substitution with Sr or La A ratio of Pb substitution with Sr and a ratio of Pb substitution with La were each expressed by mole %.

Example 1

A platinum-made lower electrode [dimension: 1.2 mm×0.8 mm×3 $\mu$m (thickness)] was formed, by screen printing, on a substrate whose diaphragm portion and fixing portion were, both made of $Y_2O_3$-stabilized $ZrO_2$ [dimension of diaphragm portion: 1.6 mm×1.1 mm×10 $\mu$m (thickness)]. A heat treatment at a temperature of 1300° C. for 2 hours was carried out to integrate the electrode with the substrate.

Thereon was laminated, by screen printing, a piezoelectric material [dimension: 1.3 mm×0.9 mm×13 $\mu$m (thickness)] made of a piezoelectric ceramic composition containing (1) 99.9% by mass of $(Pb_{0.999}La_{0.001})(Mg_{1/3}Nb_{2/3})_{0.375}Ti_{0.375}Zr_{0.250}O_3$ (wherein part of Pb was substituted with 0.1 mole % of La) (average particle diameter: 0.49 $\mu$m, maximum particle diameter: 1.8 $\mu$m) and (2) 0.100% by mass of $CeO_2$.

Then, an atmosphere-controlling material having the same composition as the piezoelectric material was placed in a vessel, and the laminate of the piezoelectric material on the electrode-formed substrate was heat-treated in the vessel at 1,275° C. for 2 hours. The thickness of the piezoelectric layer after the heat treatment was 20 $\mu$m.

Then, on the piezoelectric layer, a gold-made upper electrode [dimension: 1.2 mm×0.8 mm×0.5 $\mu$m (thickness)] was formed by screen printing, followed by heat treatment at 600° C., to produce a piezoelectric device.

Examples 2 to 5 and Comparative Example 1

Piezoelectric materials each made of a piezoelectric ceramic composition having the same formulation as in Example 1 were used, except that part of the Pb was substituted with La according to the substitution ratio shown in Table 1. Other respects whereby piezoelectric devices were produced were the same as in Example 1.

Examples 6 to 10

Piezoelectric materials each made of a piezoelectric ceramic composition having the same formulation as in Example 1 were used, except that part of the Pb was substituted with Sr according to the substitution ratio shown in Table 1. Other respects whereby piezoelectric devices were produced were the same as in Example 1.

Examples 11 to 15 and Comparative Examples 2 to 4

Piezoelectric materials each made of a piezoelectric ceramic composition having the same formulation as in Example 1 were used, except that part of the Pb was substituted with La and Sr according to the substitution ratios shown in Table 1 and $CeO_2$ was included in the ratio shown in Table 1. The respective piezoelectric devices were produced in the same manner as in Example 1 except for the above mentioned differences.

Examples 16 to 25

The piezoelectric materials used were each made of a piezoelectric ceramic composition having a formulation in which part of Pb was substituted with La and Sr according to substitution ratios shown in Table 1 and the molar ratio (expressed in Table 1 simply as "A/B") of total mole of Pb, Sr and La to total mole of Mg, Nb, Zr and Ti was as shown in Table 1. The respective piezoelectric devices were produced in the same manner as in Example 1 except for the above mentioned difference.

Evaluation (1) Examples 1 to 5 and Comparative Example 1

As shown in Table 1, the piezoelectric device of Comparative Example 1 showed a very low flexural displacement of 1.64 $\mu$m. This device was composed of a ceramic composition obtained by adding Ce in an amount of 0.100% by mass (in terms of $CeO_2$) to a PMN-PZT system composition in which Pb was not substituted with any of La and Sr.

In contrast, the piezoelectric devices of Examples 1 to 5 showed a large flexural displacements of 1.84 $\mu$m or more. These devices were composed of a ceramic composition obtained by adding Ce in an amount of 0.100% by mass (in terms of $CeO_2$) to a PMN-PZT system composition in which Pb was substituted with La by 0.1 to 1.3 mole %, respectively. The piezoelectric devices of Examples 2 to 4 that were made of a ceramic composition obtained by adding Ce in an amount of 0.100% by mass (in terms of $CeO_2$) to a PMN-PZT system composition in which Pb was substituted with La by 0.3 to 1.0 mole % showed particularly large flexural displacements of 2.12 $\mu$m or more. The largest flexural displacement of 2.21 $\mu$m was obtained in the piezoelectric device of Example 3 that was made of a ceramic composition obtained by adding Ce in an amount of 0.100% by mass (in terms of $CeO_2$) to a PMN-PZT system composition in which Pb was substituted with La by 0.7 mole %.

(2) Examples 6 to 10

As shown in Table 1, the piezoelectric devices of Examples 6 to 10 showed large flexural displacements of 1.82 $\mu$m or more, respectively. Those devices were made of a ceramic composition obtained by adding Ce in an amount of 0.100% by mass (in terms of $CeO_2$) to a PMN-PZT system composition in which Pb was substituted with Sr by 1.0 to 13.0 mole %. The piezoelectric devices of Examples 7 to 9 showed particularly large flexural displacements of 1.98 $\mu$m or more, and they were made of a ceramic composition obtained by adding Ce in an amount of 0.100% by mass (in terms of $CeO_2$) to a PMN-PZT system composition in which Pb was substituted with La by 3 to 10.0 mole %. The largest flexural displacement of 2.13 $\mu$m was obtained in the piezoelectric device of Example 8 made of a ceramic composition obtained by adding Ce in an amount of 0.100% by mass (in terms of $CeO_2$) to a PMN-PZT system composition in which Pb was substituted with La by 6.0 mole %.

(3) Examples 11 to 15 and Comparative Examples 2 to 4

As shown in Table 1, the piezoelectric devices of Comparative Examples 2 and 3 showed very low flexural displacements of at 1.69 $\mu$m or less. Those devices were made of a ceramic composition obtained by adding Ce in an amount of 0.005% by mass or less (in terms of $CeO_2$) to a PMN-PZT system composition in which part of Pb was substituted with La and Sr, and also in the flexural displacement of Comparative Example 4 using a ceramic composition obtained by adding Ce in an amount of 1.000% by mass (in terms of $CeO_2$) to the same similar PMN-PZT system composition.

In contrast, the piezoelectric devices of Examples 11 to 15 showed large flexural displacements of 1.92 $\mu$m or more. Those devices were made of a ceramic composition obtained by adding Ce in an amount of 0.010 to 0.500% by mass (in terms of $CeO_2$) to a PMN-PZT system composition in which part of Pb was substituted with La and Sr. The piezoelectric devices of Examples 12 and 13 showed extremely large flexural displacements of 2.35 $\mu$m or more. Those devices were made of a ceramic composition obtained by adding Ce in an amount of 0.050 to 0.100% by mass (in terms of $CeO_2$) to a PMN-PZT system composition in which part of Pb was substituted with La and Sr.

Flexural displacement was very large in the piezoelectric device of Example 13, as compared with those in the piezoelectric devices of Examples 1 to 10 that were made of a ceramic composition each obtained by adding the same amount of Ce to a PMN-PZT system composition in which Pb was substituted with either Sr or La.

(4) Examples 16 to 25

As shown in Table 1, all of the piezoelectric devices of Examples 16 to 25 showed large flexural displacements of 2.33 $\mu$m or more.

Surprisingly, flexural displacements showed a bimodal fluctuation, in accordance with the change of A/B ratio. That is, the piezoelectric device of Example 16 having an A/B ratio of 0.94 and the piezoelectric device of Example 25 having an A/B ratio of 1.06 showed lower flexural displacements of 2.33 $\mu$m and 2.34 $\mu$m. respectively, compared with the flexural displacement of Example 13 having an A/B ratio of 1.00. Meanwhile, the piezoelectric device of Example 17 having an A/B ratio of 0.95 and the piezoelectric device of Example 24 having an A/B ratio of 1.05 showed sharply increased flexural displacements of 2.38 $\mu$m and 2.39 $\mu$m, respectively, and these displacements are clearly larger, compared with that of the piezoelectric device of Example 13. Also, the peak value in the flexural displacements was observed both in the piezoelectric device of Example 18 having an A/B ratio of 0.96 and the piezoelectric device of Example 23 having an A/B ratio of 1.04 that showed the displacements of 2.43 $\mu$m and 2.41 $\mu$m, respectively. That is, as the A/B ratio comes near to 1.00 (stoichiometric compositional ratio), flexural displacement shows a tendency of decreasing. For example, in the case of the piezoelectric device of Example 20 having an A/B ratio of 0.99 and the piezoelectric device of Example 21 having an A/B ratio of 1.01, the flexural displacements were both 2.36 μm which was almost equal to that in the piezoelectric device of Example 13.

TABLE 1

|  | Compositional molar ratio (A/B) | CeO$_2$ content (mass %) | Ratio of Substitution with Sr (%) | Ratio of substitution with La (%) | Flexural Displacement μm |
|---|---|---|---|---|---|
| Comparative Example 1 | 1.00 | 0.100 | 0.0 | 0.0 | 1.64 |
| Example 1 | 1.00 | 0.100 | 0.0 | 0.1 | 1.84 |
| Example 2 | 1.00 | 0.100 | 0.0 | 0.3 | 2.13 |
| Example 3 | 1.00 | 0.100 | 0.0 | 0.7 | 2.21 |
| Example 4 | 1.00 | 0.100 | 0.0 | 1.0 | 2.12 |
| Example 5 | 1.00 | 0.100 | 0.0 | 1.3 | 1.86 |
| Example 6 | 1.00 | 0.100 | 1.0 | 0.0 | 1.85 |
| Example 7 | 1.00 | 0.100 | 3.0 | 0.0 | 2.03 |
| Example 8 | 1.00 | 0.100 | 6.0 | 0.0 | 2.13 |
| Example 9 | 1.00 | 0.100 | 10.0 | 0.0 | 1.98 |
| Example 10 | 1.00 | 0.100 | 13.0 | 0.0 | 1.82 |
| Comparative Example 2 | 1.00 | 0.000 | 6.0 | 0.7 | 1.67 |
| Comparative Example 3 | 1.00 | 0.005 | 6.0 | 0.7 | 1.69 |
| Example 11 | 1.00 | 0.010 | 6.0 | 0.7 | 1.92 |
| Example 12 | 1.00 | 0.050 | 6.0 | 0.7 | 2.35 |
| Example 13 | 1.00 | 0.100 | 6.0 | 0.7 | 2.36 |
| Example 14 | 1.00 | 0.400 | 6.0 | 0.7 | 2.15 |
| Example 15 | 1.00 | 0.500 | 6.0 | 0.7 | 2.05 |
| Comparative Example 4 | 1.00 | 1.000 | 6.0 | 0.7 | 1.68 |
| Example 16 | 0.94 | 0.100 | 6.0 | 0.7 | 2.33 |
| Example 17 | 0.95 | 0.100 | 6.0 | 0.7 | 2.38 |
| Example 18 | 0.96 | 0.100 | 6.0 | 0.7 | 2.43 |
| Example 19 | 0.98 | 0.100 | 6.0 | 0.7 | 2.39 |
| Example 20 | 0.99 | 0.100 | 6.0 | 0.7 | 2.36 |
| Example 21 | 1.01 | 0.100 | 6.0 | 0.7 | 2.36 |
| Example 22 | 1.02 | 0.100 | 6.0 | 0.7 | 2.39 |
| Example 23 | 1.04 | 0.100 | 6.0 | 0.7 | 2.41 |
| Example 24 | 1.05 | 0.100 | 6.0 | 0.7 | 2.39 |
| Example 25 | 1.06 | 0.100 | 6.0 | 0.7 | 2.34 |

As described above, the present invention can provide a piezoelectric/electrostrictive device which is superior in oscillation transmission between the substrate and the piezoelectric/electrostrictive layer, gives a large displacement, and seldom causes dielectric breakdown or short circuit.

What is claimed is:

1. A piezoelectric/electrostrictive device comprising:
   a ceramic substrate;
   at least one piezoelectric/electrostrictive layer comprising a piezoelectric/electrostrictive ceramic composition and being formed on said ceramic substrate; and
   at least one pair of electrodes electrically connected to said piezoelectric/electrostrictive layer;
   wherein said piezoelectric/electrostrictive ceramic composition contains a major component comprising a PbMg$_{1/3}$Nb$_{2/3}$O$_3$—PbZrO$_3$—PbTiO$_3$ system composition, wherein part of the Pb is substituted with at least one of Sr and La, and contains Ce in an amount of 0.01 to 0.50% by mass in terms of CeO$_2$; and
   wherein said piezoelectric/electrostrictive layer is solidly attached to said substrate directly or via part of said electrodes.

2. The piezoelectric/electrostrictive device according to claim 1, wherein part of Pb is substituted with Sr and La in said piezoelectric/electrostrictive ceramic composition.

3. The piezoelectric/electrostrictive device according to claim 2, wherein said PbMg$_{1/3}$Nb$_{2/3}$O$_3$—PbZrO$_3$—PbTiO$_3$ system composition is represented by the following compositional formula (1):

$$(Pb,Sr,La)_x(Mg_{1/3}Nb_{2/3})_a Ti_b Zr_c O_3 \qquad (1);$$

wherein x is $0.90 \leq x \leq 1.10$; a, b and c are decimal fractions falling, in coordinates formed by three coordinate axes of a, b and c, in a range of (a,b,c)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200); and a+b+c=1.00.

4. The piezoelectric/electrostrictive device according to claim 3, wherein x is in a range of $0.95 \leq x \leq 0.98$ or $1.02 \leq x \leq 1.05$.

5. The piezoelectric/electrostrictive device according to claim 4, wherein a ratio of the amount of Pb that is substituted with Sr is in a range of 3.0 to 10.0 mole %.

6. The piezoelectric/electrostrictive device according to claim 5, wherein a ratio of the amount of Pb that is substituted with La is in a range of 0.3 to 1.0 mole %.

7. The piezoelectric/electrostrictive device according to claim 4, wherein a ratio of the amount of Pb that is substituted with La is in a range of 0.3 to 1.0 mole %.

8. The piezoelectric/electrostrictive device according to claim 3, wherein a ratio of the amount of Pb that is substituted with Sr is in range of 3.0 to 10.0 mole %.

9. The piezoelectric/electrostrictive device according to claim 8, wherein a ratio of the amount of Pb that is substituted with La is in a range of 0.3 to 1.0 mole %.

10. The piezoelectric/electrostrictive device according to claim 3, wherein a ratio of the amount of Pb that is substituted with La is in a range of 0.3 to 1.0 mole %.

11. The piezoelectric/electrostrictive device according to claim 2, wherein a ratio of the amount of Pb that is substituted with Sr is in a range of 3.0 to 1.0 mole %.

12. The piezoelectric/electrostrictive device according to claim 11, wherein a ratio of the amount of Pb that is substituted with La is in a range of 0.3 to 1.0 mole %.

13. The piezoelectric/electrostrictive device according to claim 2, wherein a ratio of the amount of Pb that is substituted with La is in a range of 0.3 to 1.0 mole %.

14. The piezoelectric/electrostrictive device according to claim 1, wherein a ratio of the amount of Pb that is substituted with Sr is in a range of 3.0 to 10.0 mole %.

15. The piezoelectric/electrostrictive device according to claim 14, wherein a ratio of the amount of Pb that is substituted with La is in a range of 0.3 to 1.0 mole %.

16. The piezoelectric/electrostrictive device according to claim 1, wherein a ratio of the amount of Pb that is substituted with La is in a range of 0.3 to 1.0 mole %.

17. The piezoelectric/electrostrictive device according to claim 1, wherein a plurality of said piezoelectric/electrostrictive layers and a plurality of said electrode pairs are provided, and wherein said plurality of piezoelectric/electrostrictive layers are alternately laminated via a negative electrode or a positive electrode of said plurality of electrode pairs.

* * * * *